(12) United States Patent
Furuyama et al.

(10) Patent No.: US 10,580,944 B2
(45) Date of Patent: Mar. 3, 2020

(54) WAVELENGTH CONVERSION MEMBER, LIGHT-EMITTING DEVICE, AND METHOD FOR MANUFACTURING WAVELENGTH CONVERSION MEMBER

(71) Applicant: NIPPON ELECTRIC GLASS CO., LTD., Otsu-shi, Shiga (JP)

(72) Inventors: Tadahito Furuyama, Otsu (JP); Shunsuke Fujita, Otsu (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 0 days.

(21) Appl. No.: 16/335,691

(22) PCT Filed: Sep. 20, 2017

(86) PCT No.: PCT/JP2017/033879
§ 371 (c)(1),
(2) Date: Mar. 22, 2019

(87) PCT Pub. No.: WO2018/083903
PCT Pub. Date: May 11, 2018

(65) Prior Publication Data
US 2020/0035872 A1 Jan. 30, 2020

(30) Foreign Application Priority Data
Nov. 2, 2016 (JP) .................... 2016-214845

(51) Int. Cl.
*H01L 33/50* (2010.01)
*G02B 1/111* (2015.01)
(Continued)

(52) U.S. Cl.
CPC ............. *H01L 33/502* (2013.01); *F21K 9/64* (2016.08); *G02B 1/111* (2013.01); *G03B 21/204* (2013.01);
(Continued)

(58) Field of Classification Search
CPC ....... H01L 33/502; H01L 33/44; H01L 33/50; H01L 2933/0041; F21K 9/64; G03B 21/204; G02B 1/111
See application file for complete search history.

(56) References Cited

U.S. PATENT DOCUMENTS

| 2014/0168942 A1 | 6/2014 | Kishimoto et al. |
| 2018/0003363 A1 | 1/2018 | Furuyama |

FOREIGN PATENT DOCUMENTS

| JP | 2012-108435 A | 6/2012 |
| JP | 2012-145748 A | 8/2012 |

(Continued)

OTHER PUBLICATIONS

Official Communication issued in International Patent Application No. PCT/JP2017/033879, dated Dec. 26, 2017.

*Primary Examiner* — Joseph L Williams
*Assistant Examiner* — Jose M Diaz
(74) *Attorney, Agent, or Firm* — Keating and Bennett, LLP

(57) ABSTRACT

Provided is a wavelength conversion member that can increase the light extraction efficiency to improve the luminous efficiency. A wavelength conversion member 10 includes: a phosphor layer 1 containing a glass matrix and inorganic phosphor powder dispersed in the glass matrix; a glass layer 2 disposed on a surface of the phosphor layer 1 and having a refractive index equal to or smaller than a refractive index of the inorganic phosphor powder; and a microscopically uneven layer 3 disposed on a surface of the glass layer 2 and having a refractive index equal to or smaller than the refractive index of the glass layer 2.

16 Claims, 2 Drawing Sheets

(51) Int. Cl.
 *G03B 21/20* (2006.01)
 *H01L 33/44* (2010.01)
 *F21K 9/64* (2016.01)
(52) U.S. Cl.
 CPC ...... *H01L 33/44* (2013.01); *H01L 2933/0041* (2013.01)

(56) References Cited

FOREIGN PATENT DOCUMENTS

| | | |
|---|---|---|
| JP | 2014-031488 A | 2/2014 |
| JP | 2016-170357 A | 9/2016 |
| WO | 2013/018494 A1 | 2/2013 |
| WO | 2016/125611 A1 | 8/2016 |

[FIG. 1]
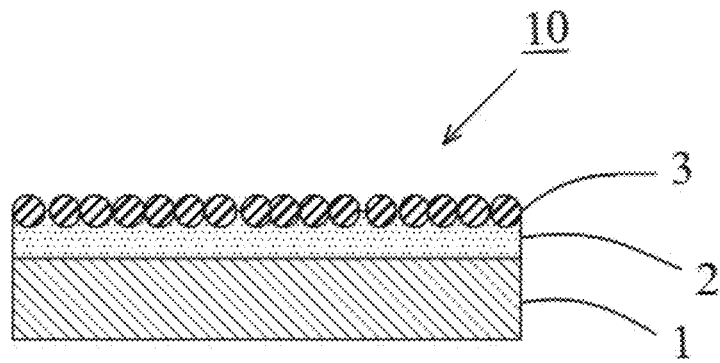
[FIG. 2]
(a)
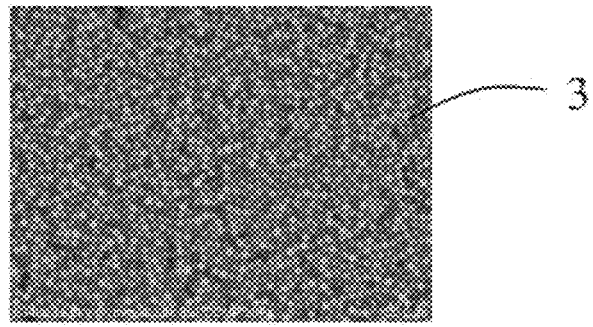
(b)
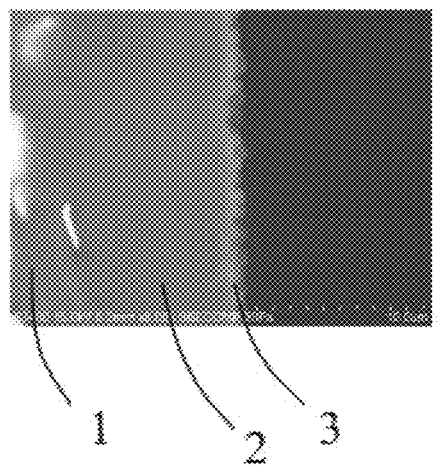

[FIG. 3]
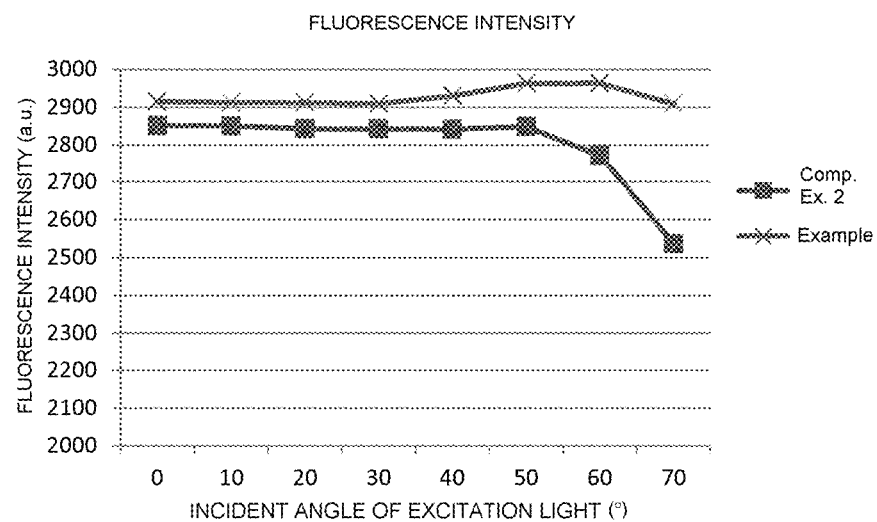
[FIG. 4]
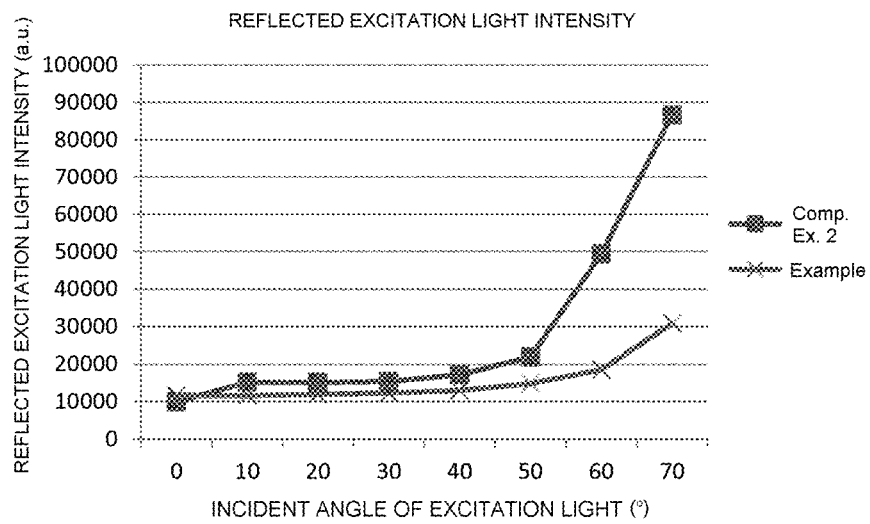

WAVELENGTH CONVERSION MEMBER, LIGHT-EMITTING DEVICE, AND METHOD FOR MANUFACTURING WAVELENGTH CONVERSION MEMBER

TECHNICAL FIELD

The present invention relates to wavelength conversion members for use in light-emitting devices, such as projectors.

BACKGROUND ART

To reduce projector size, there have recently been proposed light-emitting devices in which a light source, such as an LED (light emitting diode) or an LD (laser diode), and a phosphor are used. For example, Patent Literature 1 discloses a projector in which a light-emitting device is used that includes a light source for emitting ultraviolet light and a wavelength conversion member (a phosphor layer) for converting the ultraviolet light from the light source to visible light. The wavelength conversion member used in Patent Literature 1 is a wavelength conversion member (a fluorescent wheel) produced by forming an annular phosphor layer on top of an annular, rotatable transparent substrate.

In order to improve the luminous efficiency of a wavelength conversion member, the wavelength conversion member may be coated with an antireflection function film. For example, Patent Literature 1 discloses a wavelength conversion member formed so that a phosphor is dispersed in a resin matrix and microspheres are embedded in the surface of the member to form an uneven structure and thus give the member an antireflection function. In this manner, the light extraction efficiency of the wavelength conversion member is increased, which enables the luminous efficiency to be improved.

CITATION LIST

Patent Literature

[PTL 1]
JP-A-2012-108435

SUMMARY OF INVENTION

Technical Problem

The wavelength conversion member disclosed in Patent Literature 1 has a problem that due to light reflection at the interfaces between the phosphor layer and the microspheres, it cannot sufficiently increase the light extraction efficiency.

In view of the foregoing, the present invention has an object of providing a wavelength conversion member that can increase the light extraction efficiency to improve the luminous efficiency.

Solution to Problem

A wavelength conversion member according to the present invention includes: a phosphor layer containing a glass matrix and inorganic phosphor powder dispersed in the glass matrix; a glass layer disposed on a surface of the phosphor layer and having a refractive index equal to or smaller than a refractive index of the inorganic phosphor powder; and a microscopically uneven layer disposed on a surface of the glass layer and having a refractive index equal to or smaller than the refractive index of the glass layer.

In the wavelength conversion member according to the present invention, an antireflection function layer formed of the glass layer and the microscopically uneven layer is formed on the surface of the phosphor layer. The microscopically uneven layer has an antireflection function small in angular dependency on both incident light and outgoing light (in other words, it is less likely to make a difference in antireflection function depending on the angles of incident light and outgoing light). In this relation, the glass layer has a refractive index equal to or smaller than the refractive index of the inorganic phosphor powder and the microscopically uneven layer has a refractive index equal to or smaller than the refractive index of the glass layer. Since, as just described, the wavelength conversion member according to the present invention has a structure in which the refractive index gradually decreases in the following order: the phosphor layer (inorganic phosphor powder), the glass layer, and the microscopically uneven layer, light reflection at each of the interfaces between the layers can be reduced. As a result, the light extraction efficiency increases, so that the luminous efficiency can be improved. Particularly, if the content of inorganic phosphor powder in the phosphor layer is large, the inorganic phosphor powder is likely to be exposed on the surface of the phosphor layer, so that the refractive index on the surface of the phosphor layer tends to be high. Therefore, in this case, the wavelength conversion member is likely to be given the above effect brought about by forming the glass layer between the phosphor layer and the microscopically uneven layer.

In the wavelength conversion member according to the present invention, the microscopically uneven layer is preferably formed of microspheres.

In the wavelength conversion member according to the present invention, some of the microspheres are preferably integrated with the glass layer.

In the wavelength conversion member according to the present invention, the microspheres are preferably made of amorphous silica.

In the wavelength conversion member according to the present invention, the microspheres preferably have an average particle diameter of 0.05 to 3 μm.

In the wavelength conversion member according to the present invention, a proportion of an area of the surface of the glass layer occupied by the microscopically uneven layer is preferably 90% or more.

In the wavelength conversion member according to the present invention, the glass layer preferably has a softening point of 500° C. or more.

In the wavelength conversion member according to the present invention, the glass layer preferably has a thickness of 0.1 mm or less.

In the wavelength conversion member according to the present invention, a difference in softening point between the glass matrix and the glass layer is preferably 200° C. or less.

In the wavelength conversion member according to the present invention, a difference between a coefficient of thermal expansion of the phosphor layer and a coefficient of thermal expansion of the glass layer is preferably 100× $10^{-7}$/° C. or less.

In the wavelength conversion member according to the present invention, a content of the inorganic phosphor powder in the phosphor layer is preferably 20 to 80% by volume.

In the wavelength conversion member according to the present invention, a dielectric multi-layer film is preferably formed on the microscopically uneven layer.

The wavelength conversion member according to the present invention is suitable for a projector.

A light-emitting device according to the present invention includes: the above-described wavelength conversion member; and a light source capable of irradiating the wavelength conversion member with light having an excitation wavelength for the inorganic phosphor powder.

A method for manufacturing a wavelength conversion member according to the present invention is a method for manufacturing the above-described wavelength conversion member and includes the steps of: preparing a green sheet containing glass powder and inorganic phosphor powder; producing a laminate by forming on a surface of the green sheet a layer containing glass powder and a layer containing microspheres in this order; and firing the laminate.

In the method for manufacturing the wavelength conversion member according to the present invention, the laminate is preferably fired to integrate some of the microspheres with the glass layer.

Advantageous Effects of Invention

The present invention enables provision of a wavelength conversion member that can increase the light extraction efficiency to improve the luminous efficiency.

BRIEF DESCRIPTION OF DRAWINGS

FIG. 1 is a schematic cross-sectional view showing a wavelength conversion member according to an embodiment of the present invention.

FIG. 2(a) is a top photograph of a wavelength conversion member obtained in Example. FIG. 2(b) is a cross-sectional photograph of the wavelength conversion member obtained in Example.

FIG. 3 is a graph showing the fluorescence intensities of wavelength conversion members in Example and Comparative Example 2 when the incident angle of excitation light is varied.

FIG. 4 is a graph showing the reflected excitation light intensities of the wavelength conversion members in Example and Comparative Example 2 when the incident angle of excitation light is varied.

DESCRIPTION OF EMBODIMENTS

Hereinafter, a description will be given of an embodiment of a wavelength conversion member according to the present invention with reference to the drawings.

FIG. 1 is a schematic cross-sectional view showing a wavelength conversion member 10 according to an embodiment of the present invention. The wavelength conversion member 10 includes a phosphor layer 1, a glass layer 2 disposed on a surface of the phosphor layer 1, and a microscopically uneven layer 3 disposed on a surface of the glass layer 2. In this relation, the glass layer 2 has a refractive index equal to or smaller than the refractive index of inorganic phosphor powder and the microscopically uneven layer 3 has a refractive index equal to or smaller than the refractive index of the glass layer 2. With this structure, light reflection at each of the interfaces between the layers can be reduced, so that the light extraction efficiency can be increased.

The phosphor layer 1 contains a glass matrix and inorganic phosphor powder dispersed in the glass matrix. The shape of the phosphor layer 1 is, for example, a rectangular plate shape, a disc shape or a wheel shape.

No particular limitation is placed on the type of the glass matrix so long as it can be used as a dispersion medium for the inorganic phosphor powder. For example, a borosilicate-based glass or the like can be used. Examples of the borosilicate-based glass include those containing, in % by mass, 30 to 85% $SiO_2$, 0 to 30% $Al_2O_3$, 0 to 50% $B_2O_3$, 0 to 10% $Li_2O+Na_2O+K_2O$, and 0 to 50% $MgO+CaO+SrO+BaO$.

The softening point of the glass matrix is preferably 300 to 1000° C., more preferably 500 to 1000° C., and particularly preferably 600 to 900° C. If the softening point of the glass matrix is too low, the mechanical strength and chemical durability of the phosphor layer become likely to decrease. Furthermore, because of low thermal resistance of the glass matrix itself, the glass matrix may be softened and deformed by heat produced from the inorganic phosphor powder. On the other hand, if the softening point of the glass matrix is too high, the inorganic phosphor powder may degrade in the firing step during production, so that the luminescence intensity of the wavelength conversion member 10 may decrease.

No particular limitation is placed on the type of the inorganic phosphor powder so long as it emits fluorescence upon incidence of excitation light. Specific examples of the inorganic phosphor powder include powders of one or more selected from the group consisting of, for example, oxide phosphor, nitride phosphor, oxynitride phosphor, chloride phosphor, oxychloride phosphor, sulfide phosphor, oxysulfide phosphor, halide phosphor, chalcogenide phosphor, aluminate phosphor, halophosphoric acid chloride phosphor, and garnet-based compound phosphor. In using a blue light as the excitation light, phosphors each capable of emitting, for example, a green light, a yellow light or a red light as fluorescence can be used.

The refractive index (nd) of the inorganic phosphor powder is normally preferably 1.45 to 1.95 and more preferably 1.55 to 1.90.

The average particle diameter of the inorganic phosphor powder is preferably 1 μm to 50 μm and more preferably 5 μm to 25 μm. If the average particle diameter of the inorganic phosphor powder is too small, the luminescence intensity may decrease. On the other hand, if the average particle diameter of the inorganic phosphor powder is too large, the luminescent color may become uneven.

As used herein, the average particle diameter refers to the particle diameter ($D_{50}$) when in a volume-based cumulative particle size distribution curve as determined by laser diffractometry the integrated value of cumulative volume from the smaller particle diameter is 50%.

The content of the inorganic phosphor powder in the phosphor layer 1 is preferably 20 to 80% by volume, more preferably 30 to 75% by volume, and particularly preferably 40 to 70% by volume. If the content of the inorganic phosphor powder is too small, the luminescence intensity becomes insufficient. On the other hand, if the content of the inorganic phosphor powder is too large, the mechanical strength of the phosphor layer 1 becomes likely to decrease.

The thickness of the phosphor layer 1 needs to be such that excitation light can be surely absorbed into the phosphor, but is preferably as small as possible. The reason for this is that if the phosphor layer 1 is too thick, scattering and absorption of light in the phosphor layer 1 may become too much, so that the efficiency of emission of fluorescence may become low. Specifically, the thickness of the phosphor layer 1 is preferably not more than 1 mm, more preferably not more than 0.5 mm, and particularly preferably not more than 0.3 mm. The lower limit of the thickness of the phosphor layer 1 is normally about 0.03 mm.

A borosilicate-based glass or the like can be used as the glass layer 2. Examples of the borosilicate-based glass include those containing, in % by mass, 30 to 85% $SiO_2$, 0 to 30% $Al_2O_3$, 0 to 50% $B_2O_3$, 0 to 10% $Li_2O+Na_2O+K_2O$, and 0 to 50% $MgO+CaO+SrO+BaO$.

The softening point of the glass layer 2 is preferably 300 to 1000° C., more preferably 500 to 1000° C., and particularly preferably 600 to 900° C. If the softening point of the glass layer 2 is too low, the mechanical strength and chemical durability of the glass layer 2 become likely to decrease. Furthermore, the glass layer 2 may be softened and deformed by heat produced from the inorganic phosphor powder. On the other hand, if the softening point of the glass layer 2 is too high, the inorganic phosphor powder may degrade in the firing step during production, so that the luminescence intensity of the wavelength conversion member 10 may decrease. Note that, in order to melt some of the microspheres to be dispersed and incorporated into the glass layer 2 in the firing step during the formation of the microscopically uneven layer 3 on the glass layer 2 as will be described hereinafter, the glass layer 2 preferably has a softening point of 500° C. or more.

The difference in softening point between the glass matrix in the phosphor layer 1 and the glass layer 2 is preferably 200° C. or less and particularly preferably 100° C. or less and both the layers preferably have approximately the same softening point (for example, the glass matrix in the phosphor layer 1 and the glass layer 2 are preferably made of a glass having the same composition). If the difference in softening point between both the layers is too large, the glasses used in the respective layers show different softened and fluidized states in the firing step during production, so that the properties are likely to vary from lot to lot.

No particular limitation is placed on the refractive index (nd) of the glass layer 2 so long as it is equal to or smaller than the refractive index of the inorganic phosphor powder. For example, the refractive index (nd) of the glass layer 2 is preferably 1.9 or less, more preferably 1.85 or less, still more preferably 1.8 or less, yet still more preferably 1.7 or less, and particularly preferably 1.6 or less. On the other hand, although no particular limitation is placed on the lower limit of the refractive index of the glass layer 2, it is, on a realistic level, preferably 1.4 or more and more preferably 1.45 or more.

For example, the glass layer 2 is fusion-bonded to the phosphor layer 1. From the viewpoint of increasing the adhesion strength between the phosphor layer 1 and the glass layer 2, the difference in coefficient of thermal expansion (at 30 to 380° C.) between the phosphor layer 1 and the glass layer 2 is preferably $100\times10^{-7}/°$ C. or less, more preferably $80\times10^{-7}/°$ C. or less, still more preferably $60\times10^{-7}/°$ C. or less, and particularly preferably $40\times10^{-7}/°$ C. or less.

If the thickness of the glass layer 2 is too large, excitation light or fluorescence tends to spread in the glass layer 2 in a direction parallel to the surface thereof or to be absorbed in the glass layer 2, resulting in decreased luminescence intensity. Therefore, the thickness of the glass layer 2 is preferably not more than 0.1 mm, more preferably not more than 0.05 mm, still more preferably not more than 0.03 mm, and particularly preferably not more than 0.02 mm. No particular limitation is placed on the lower limit of the thickness of the glass layer 2, but it is, on a realistic level, preferably 0.003 mm or more and more preferably 0.01 mm or more.

From the viewpoint of making excitation light and fluorescence less likely to be absorbed in the glass layer 2, the glass layer 2 preferably has a total light transmittance of preferably 50% or more, more preferably 65% or more, and particularly preferably 80% or more.

The microscopically uneven layer 3 is formed of, for example, amorphous silica microspheres. Specifically, the microscopically uneven layer 3 is formed so that a plurality of microspheres are bonded to the surface of the glass layer 2 with some of the microspheres embedded into the surface of the glass layer 2. Particularly, some of the microspheres are preferably melted to be dispersed and incorporated into the glass layer 2 in the firing step during the formation of the microscopically uneven layer 3 on the glass layer 2, so that the some of the microspheres are integrated with the glass layer 2 in the absence of interfaces between them. In this case, some of the microspheres project from the glass layer 2, which thus forms the microscopically uneven layer 3. By doing so, light reflection at the interfaces between the microspheres and the glass layer 2 is reduced, so that the light extraction efficiency is likely to be improved.

The amorphous silica particles that can be used are those produced by a dry method, such as, for example, a combustion method or an arc method, or a wet method, such as a sol-gel method represented by a liquid glass method and an alkoxide method. Aside from the above, commercialized products, such as a product named "Sciqas" (manufactured by Sakai Chemical Industry Co., Ltd.), a product named "ADMAFINE" (manufactured by Admatechs Company Limited) or products named "TG-C190 series" (manufactured by Cabot Corporation), can also be used.

No particular limitation is placed on the refractive index (nd) of the microscopically uneven layer 3 so long as it is equal to or smaller than the refractive index of the glass layer 2. For example, the refractive index (nd) of the microscopically uneven layer 3 is preferably 1.55 or less, more preferably 1.49 or less, and particularly preferably 1.47 or less. On the other hand, although no particular limitation is placed on the lower limit of the refractive index of the microscopically uneven layer 3, it is, on a realistic level, preferably 1.40 or more and more preferably 1.42 or more.

When the particle diameter of the microspheres is small, a so-called "size effect" gives rise to a melting point depression of the microspheres, so that the microspheres are easily melted to be dispersed and incorporated into the glass layer 2. Therefore, the average particle diameter of the microspheres is preferably 3 μm or less, more preferably 2 μm or less, and particularly preferably 1 μm or less. However, if the average particle diameter of the microspheres is too small, the microspheres are wholly incorporated into the glass layer 2, so that a microscopically uneven structure is less likely to be formed. Therefore, the average particle diameter of the microspheres is preferably not less than 0.05 μm, more preferably not less than 0.1 μm, still more preferably not less than 0.3 μm, yet still more preferably not less than 0.4 μm, and particularly preferably not less than 0.5 μm.

The proportion of the area of the surface of the glass layer 2 occupied by the microscopically uneven layer 3 is preferably 90% or more, more preferably 95% or more, still more preferably 99% or more, and particularly preferably approximately 100%. If the above proportion of the area is too low, the light antireflection function decreases, so that a desired light extraction efficiency is less likely to be achieved.

A dielectric multi-layer film may be formed on the microscopically uneven layer 3. Thus, the antireflection effect can be increased. The dielectric multi-layer film is formed so that low-refractive index layers and high-refractive index layers are alternately laid one on top of the other. An example of the low-refractive index layer is silicon oxide. Examples of the high-refractive index layer include: oxides, such as niobium oxide, titanium oxide, lanthanum oxide, tantalum oxide, yttrium oxide, gadolinium oxide, tungsten oxide, hafnium oxide, and aluminum oxide; fluorides, such as magnesium fluoride and calcium fluoride; and nitrides, such as silicon nitride. No particular limitation is placed on the thickness of the dielectric multi-layer film. However, if the thickness is too large, the dielectric multi-layer film is likely to peel away. Therefore, the thickness is preferably 500 nm or less, and particularly preferably 200 nm or less.

The glass layer 2 and the microscopically uneven layer 3 may be formed on both the surfaces of the phosphor layer 1. By doing so, when the wavelength conversion member 10 is used as a transmission-type wavelength conversion member, the incidence efficiency of excitation light on the phosphor layer 1 can be increased and the emission efficiency of fluorescence from the phosphor layer 1 can be increased.

Alternatively, a reflective layer may be formed on the surface of the phosphor layer 1 opposite to the glass layer 2. By doing so, the wavelength conversion member can be used as a reflection-type wavelength conversion member. Examples of the reflective layer that can be used include those made of a metal, such as aluminum or silver or those made of a dense or porous ceramic, such as alumina, titania or zirconia.

Next, a description will be given of an example of a method for manufacturing the wavelength conversion member 10.

First, a green sheet is prepared which contains: glass powder that will form a glass matrix of a phosphor layer 1; and inorganic phosphor powder. Specifically, a slurry containing glass powder, inorganic phosphor powder, and organic components, including a binder resin, a solvent, and a plasticizer, is applied onto a resin film made of polyethylene terephthalate or other materials by the doctor blade method or other methods and then dried by the application of heat, thus producing a green sheet for a phosphor layer 1.

Next, a layer containing glass powder and a layer containing microspheres are formed in this order on the surface of the green sheet, thus producing a laminate.

The layer containing glass powder is formed of, for example, a green sheet of glass powder that will form a glass layer 2. Specifically, a slurry containing glass powder and organic components, including a binder resin, a solvent, and a plasticizer, is applied onto a resin film made of polyethylene terephthalate or other materials by the doctor blade method or other methods and then dried by the application of heat, thus producing a green sheet for a glass layer 2.

Likewise, the layer containing microspheres is formed of, for example, a green sheet of microspheres that will form a microscopically uneven layer 3. Specifically, a slurry containing microspheres and organic components, including a binder resin, a solvent, and a plasticizer, is applied onto a resin film made of polyethylene terephthalate or other materials by the doctor blade method or other methods and then dried by the application of heat, thus producing a green sheet for a microscopically uneven layer 3.

When the obtained laminate is fired, a wavelength conversion member 10 is obtained in which the phosphor layer 1, the glass layer 2, and the microscopically uneven layer 3 are fusion-bonded. After the firing of the laminate, surplus microspheres or so on may be washed out as necessary. The firing temperature is preferably in a range of ±100° C. from the softening point of the glass powders used in the phosphor layer 1 and the glass layer 2, and particularly preferably in a range of ±50° C. from the softening point of the glass powders. If the firing temperature is too low, the layers are less likely to be fused. Furthermore, the sintering of the glass powder becomes insufficient, so that the mechanical strength of the phosphor layer 1 or the glass layer 2 is likely to decrease. On the other hand, if the firing temperature is too high, the inorganic phosphor powder in the phosphor layer 1 may degrade to decrease the luminescence intensity.

Although in the above method the green sheet for a phosphor layer 1, the green sheet for a glass layer 2, and the green sheet for a microscopically uneven layer 3 are laid one on top of another and then concurrently fired, the procedure is not limited to this. For example, it is also possible to lay the green sheet for a phosphor layer 1 and the green sheet for a glass layer 2 one on the other, fire the green sheets, then lay the green sheet for a microscopically uneven layer 3 on top of the obtained glass layer 2, and then fire the green sheet to form the microscopically uneven layer 3.

Aside from the above methods, it is also possible to apply a slurry for a glass layer 2 on a surface of a phosphor layer 1, then fire the slurry to form the glass layer 2 on top of the phosphor layer 1, then apply a slurry for a microscopically uneven layer 3 on s surface of the glass layer 2, and then fire the slurry to form the microscopically uneven layer 3. As the slurry for a glass layer 2 and the slurry for a microscopically uneven layer 3 to be used in this case, respective slurries for use in production of the green sheet for a glass layer 2 and production of the green sheet for a microscopically uneven layer 3 can be used.

In each of the above manufacturing methods, a degreasing process for removing organic matter may be performed before the firing of the green sheet or the slurry. Furthermore, during laying of the layers including the green sheets, the layers may be appropriately bonded by the application of heat and pressure in order to increase the adhesiveness between them.

A light-emitting device according to the present invention includes the wavelength conversion member 10 and a light source capable of irradiating the wavelength conversion member 10 with light having an excitation wavelength for the inorganic phosphor powder. An LED, LD or the like can be used as the light source. Excitation light emitted from the light source is converted in wavelength to fluorescence in the phosphor layer of the wavelength conversion member and the fluorescence is emitted together with excitation light from the wavelength conversion member. In this case, if the wavelength conversion member includes the reflective layer, fluorescence and excitation light are emitted through the side where the wavelength conversion member has been irradiated with the excitation light. If the wavelength conversion member does not include the reflective layer, fluorescence and excitation light are emitted through the side opposite to the side where the wavelength conversion member has been irradiated with the excitation light.

EXAMPLES

The present invention will be described below with reference to examples, but the present invention is not limited to the following examples.

Example 1

(a) Production of Green Sheet for Phosphor Layer

Raw materials were compounded to provide a composition of 71% $SiO_2$, 6% $Al_2O_3$, 13% $B_2O_3$, 1% $K_2O$, 7% $Na_2O$, 1% CaO, and 1% BaO and subjected to a melt-quenching process, thus forming a glass in a film shape. The obtained glass film was wet ground using a ball mill to obtain glass powder (refractive index nd: 1.49, softening point: 775° C., coefficient of thermal expansion: $51 \times 10^{-7}$/° C.) having an average particle diameter ($D_{50}$) of 2 μm.

The obtained glass powder and YAG phosphor powder (yttrium aluminum garnet, $Y_3Al_5O_{12}$, refractive index nd: 1.84) having an average particle diameter ($D_{50}$) of 23 μm were mixed using a vibrational mixer to give a ratio of glass powder to phosphor powder of 30% by volume to 70% by volume. Organic components, including a binder, a plasticizer, and a solvent, were added in appropriate amounts to 50 g of the obtained mixed powder and the mixture was kneaded in a ball mill for 12 hours, thus obtaining a slurry. This slurry was applied onto a polyethylene terephthalate film using the doctor blade method and dried, thus obtaining a green sheet for a phosphor layer (with a thickness of 150 μm).

(b) Production of Green Sheet for Glass Layer

Organic components, including a binder, a plasticizer, and a solvent, were added in appropriate amounts to 50 g of glass powder obtained in (a) and the mixture was kneaded in a ball mill for 12 hours, thus obtaining a slurry. This slurry was applied onto a polyethylene terephthalate film using the doctor blade method and dried, thus obtaining a green sheet for a glass layer (with a thickness of 25 μm).

(c) Production of Green Sheet for Microscopically Uneven Layer

Organic components, including a binder, a plasticizer, and a solvent, were appropriately added to 50 g of amorphous silica spheres (Sciqas manufactured by Sakai Chemical Industry Co., Ltd., average particle diameter: 1 μm, refractive index nd: 1.46) and the mixture was kneaded in a ball mill for 12 hours, thus obtaining a slurry. This slurry was applied onto a polyethylene terephthalate film using the doctor blade method and dried, thus obtaining a green sheet for a microscopically uneven layer.

(d) Production of Wavelength Conversion Member

The green sheet for a phosphor layer, the green sheet for a glass layer, and the green sheet for a microscopically uneven layer were laid one on top of another in this order, and a pressure of 15 kPa was applied to them at 90° C. for one minute using a thermocompression bonder, thus producing a laminate. The laminate was cut into a 25 mm diameter sized piece and the piece was then subjected to a degreasing treatment by increasing the temperature from ordinary temperature to 600° C. at a rate of 1° C./min and then keeping it at 600° C. for an hour. Thereafter, the piece was fired at 800° C. for an hour, thus producing a wavelength conversion member. After the firing, the thickness of the phosphor layer was 130 μm and the thickness of the glass layer was 10 μm. Furthermore, the proportion of the area of the surface of the glass layer occupied by the microscopically uneven layer was 96%. A top photograph of the obtained wavelength conversion member and a cross-sectional photograph thereof (a magnified photograph near the surface layer) are shown in FIGS. 2(a) and 2(b), respectively.

Example 2

A wavelength conversion member was produced in the same manner as in Example 1 except that the amorphous silica spheres used were changed to Sciqas manufactured by Sakai Chemical Industry Co., Ltd. and having an average particle diameter of 0.7 μm.

Example 3

A wavelength conversion member was produced in the same manner as in Example 1 except that the amorphous silica spheres used were changed to ADMAFINE manufactured by Admatechs Company Limited and having an average particle diameter of 0.5 μm.

Example 4

A wavelength conversion member was produced in the same manner as in Example 1 except that the amorphous silica spheres used were changed to Sciqas manufactured by Sakai Chemical Industry Co., Ltd. and having an average particle diameter of 0.4 μm.

Comparative Example 1

A wavelength conversion member was produced in the same manner as in Example 1 except that no glass layer was formed between the phosphor layer and the microscopically uneven layer.

Comparative Example 2

A wavelength conversion member was produced in the same manner as in Example 1 except that no microscopically uneven layer was formed on the surface of the glass layer.

<Evaluations>

(a) Evaluation of Fluorescence Intensity

An aluminum reflective substrate (MIRO-SILVER manufactured by Material House Co., Ltd.) was bonded with an adhesive (silicone resin manufactured by Shin-Etsu Chemical Co., Ltd.) to a surface of each of the wavelength conversion members obtained in Examples 1 to 4 and Comparative Examples 1 and 2, the surface being opposite to the side on which the microscopically uneven layer (or the glass layer) was formed, thus producing a measurement sample. The measurement sample was fixed to the rotary shaft of a motor. As an excitation light source, a light source was prepared which can focus light from a laser unit formed of 30 arrayed 1 W-class laser elements to a 1 mm diameter size with a collecting lens. The optical power of this light source was 30 W and the wavelength was 440 nm. The measurement sample was irradiated with excitation light while being rotated at 7000 RPM and the obtained fluorescence was received via an optical fiber by a compact size spectrometer (USB-4000 manufactured by Ocean Optics Inc.) to obtain luminescence spectra. The fluorescence intensity was determined from the luminescence spectra. The results are shown in Table 1.

TABLE 1

|  | Examples | | | | Comparative Examples | |
| --- | --- | --- | --- | --- | --- | --- |
|  | 1 | 2 | 3 | 4 | 1 | 2 |
| Glass Layer | formed | formed | formed | formed | not formed | formed |
| Microscopically Uneven Layer | formed | formed | formed | formed | formed | not formed |
| Average Particle Diameter of Amorphous Silica Spheres (μm) | 0.7 | 0.5 | 0.4 | — | — | |
| Fluorescence Intensity (a.u.) | 1360 | 1369 | 1358 | 1358 | 1334 | 1290 |

(b) Evaluation of Angular Dependency of Antireflection Function Layer

For Example 1 and Comparative Example 2, the same measurement samples as in (a) were produced. The measurement sample was fixed to the rotary shaft of a motor and irradiated with excitation light while being rotated at a rotational speed of 7000 RPM. A single blue laser element as mentioned above was used as a light source and the incident angle was varied between 0° and 70° at an interval of 10°. The reflected light was received via an optical fiber by a compact size spectrometer (USB-4000 manufactured by Ocean Optics Inc.) to obtain luminescence spectra. The fluorescence intensity and reflected excitation light intensity were determined from the luminescence spectra. The results are shown in FIGS. 3 and 4.

As shown in FIGS. 3 and 4, it can be seen that the wavelength conversion member of Example 1 exhibited good antireflection function particularly for excitation light having large incident angles. In each of the above evaluations in FIGS. 3 and 4, the values of the light intensities are indicated in an arbitrary unit (a.u.) and do not refer to the absolute values.

INDUSTRIAL APPLICABILITY

The wavelength conversion member according to the present invention is suitable for a projector. Other than the projector, the wavelength conversion member according to the present invention can also be used for an on-vehicle lighting, such as a headlamp, and other lightings.

REFERENCE SIGNS LIST 1 phosphor layer
2 glass layer
3 microscopically uneven layer
10 wavelength conversion member

The invention claimed is:

1. A wavelength conversion member comprising:
a phosphor layer containing a glass matrix and inorganic phosphor powder dispersed in the glass matrix;
a glass layer disposed on a surface of the phosphor layer and having a refractive index equal to or smaller than a refractive index of the inorganic phosphor powder; and
a microscopically uneven layer disposed on a surface of the glass layer and having a refractive index equal to or smaller than the refractive index of the glass layer.

2. The wavelength conversion member according to claim 1, wherein the microscopically uneven layer is formed of microspheres.

3. The wavelength conversion member according to claim 2, wherein some of the microspheres are integrated with the glass layer.

4. The wavelength conversion member according to claim 2, wherein the microspheres are made of amorphous silica.

5. The wavelength conversion member according to claim 1, wherein the microspheres have an average particle diameter of 0.05 to 3 μm.

6. The wavelength conversion member according to claim 1, wherein a proportion of an area of the surface of the glass layer occupied by the microscopically uneven layer is 90% or more.

7. The wavelength conversion member according to claim 1, wherein the glass layer has a softening point of 500° C. or more.

8. The wavelength conversion member according to claim 1, wherein the glass layer has a thickness of 0.1 mm or less.

9. The wavelength conversion member according to claim 1, wherein a difference in softening point between the glass matrix and the glass layer is 200° C. or less.

10. The wavelength conversion member according to the claim 1, wherein a difference between a coefficient of thermal expansion of the phosphor layer and a coefficient of thermal expansion of the glass layer is $100 \times 10^{-7}$/° C. or less.

11. The wavelength conversion member according to claim 1, wherein a content of the inorganic phosphor powder in the phosphor layer is 20 to 80% by volume.

12. The wavelength conversion member according to claim 1, wherein a dielectric multi-layer film is formed on the microscopically uneven layer.

13. The wavelength conversion member according to claim 1, being for use in a projector.

14. A light-emitting device comprising:
the wavelength conversion member according to claim 1; and
a light source capable of irradiating the wavelength conversion member with light having an excitation wavelength for the inorganic phosphor powder.

15. A method for manufacturing the wavelength conversion member according to claim 1, the method comprising the steps of:
preparing a green sheet containing glass powder and inorganic phosphor powder;
producing a laminate by forming on a surface of the green sheet a layer containing glass powder and a layer containing microspheres in this order; and
firing the laminate.

16. The method for manufacturing the wavelength conversion member according to claim 15, wherein the laminate is fired to integrate some of the microspheres with the glass layer.

* * * * *